(12) United States Patent
Garrett et al.

(10) Patent No.: US 7,398,446 B2
(45) Date of Patent: Jul. 8, 2008

(54) LOW POWER OPERATION OF AN ADDRESS INTERLEAVER

(75) Inventors: David C. Garrett, Matawan, NJ (US); Chris J. Nicol, Hornsby Heights (AU)

(73) Assignee: Lucent Technologies Inc., Murray Hill, NJ (US)

( * ) Notice: Subject to any disclaimer, the term of this patent is extended or adjusted under 35 U.S.C. 154(b) by 922 days.

(21) Appl. No.: 10/447,113

(22) Filed: May 29, 2003

(65) Prior Publication Data

US 2004/0255217 A1    Dec. 16, 2004

(51) Int. Cl.
*H04M 13/00* (2006.01)
(52) U.S. Cl. ........................ 714/755; 714/701
(58) Field of Classification Search ............... 714/755, 714/701, 702, 756, 787, 788, 798, 799, 761–762
See application file for complete search history.

(56) References Cited

U.S. PATENT DOCUMENTS

| | | | | |
|---|---|---|---|---|
| 4,045,781 | A * | 8/1977 | Levy et al. | 711/162 |
| 5,392,328 | A * | 2/1995 | Schmidt et al. | 379/27.06 |
| 5,535,333 | A * | 7/1996 | Allen et al. | 709/212 |
| 5,737,337 | A * | 4/1998 | Voith et al. | 714/702 |
| 5,966,729 | A * | 10/1999 | Phelps | 711/146 |
| 6,272,652 | B1 * | 8/2001 | Starr | 714/701 |
| 6,549,998 | B1 * | 4/2003 | Pekarich et al. | 711/220 |
| 6,748,560 | B2 * | 6/2004 | Hatakeyama | 714/702 |
| 6,910,110 | B2 * | 6/2005 | Kim et al. | 711/157 |
| 2003/0081576 | A1 * | 5/2003 | Kim et al. | 370/335 |

OTHER PUBLICATIONS

Sivakumar, R. et al, "VLSI Architectures for Computing X mod M," *IEEE Proceedings on Circuits, Devices and Systems*, vol. 142, No. 5, Oct. 1995, pp. 313-320.
Heergard, C. et al. "Turbo Coding." Kluwer Academiic Publishers, 1999, pp. 35-63.
Berrou, Claude et al. "Near Optimum Error Correcting Coding and Decoding: Turbo-Codes." *IEEE Transactions on Communications*, vol. 40, No. 10, Oct. 1996, pp. 1261-1271.
Wu, Z. "Coding and Interative Detection for Magnetic Recording Channels." Kluwer Academic Publishers, 1999, pp. 44-45.
Erfanian, Javan et al. "Reduced Complexity Symbol Detectors with Parallel Structures for ISI Channels." *IEEE Transaction on Communications*. vol. 42, Feb./Mar./Apr. 1994, pp. 1661-1671.
Summers, Todd et al. "SNR Mismatch and Online Estmation in Turbo Decoding." *IEEE Transaction on Communications*. vol. 41, 1998, pp. 421-423.
Pietrobon, Steven S. "Implementation and Performance Of A Turbo/Map Decoder." *International Journal of Satellite Communications*, 16, 1998, pp. 23-46.

(Continued)

*Primary Examiner*—Jacques Louis-Jacques
*Assistant Examiner*—Fritz Alphonse

(57) ABSTRACT

A first interleaved address generator is configured to generate a first interleaved address, and a second interleaved address generator is configured to generate a second interleaved address substantially concurrently with the first interleaved address generator generating the first interleaved address. A controller is configured to disable the second interleaved address generator from generating the second interleaved address if the second interleaved address is not needed to produce a continuous stream of interleaved addresses.

12 Claims, 6 Drawing Sheets

OTHER PUBLICATIONS

Robertson, Patrick et al. "Optimal and Sub-Optimal Maximum a Posteriori Algorithms Suitable for Turbo Decoding." International Conference on Communications, 1995, pp. 1009-1013.

Bahl, L.R. et al. "Optimal Decoding of Linear Codes for Minimizing Symbol Error Rate." *IEEE Trans. Inform. Theory*, vol. IT-20, Mar. 1974, pp. 284-287.

Robertson, Patrick et al. "A Comparison of Optimal and Sub-Optimal MAP Decoding Algorithms Operating in the Log Domain." IEEE 1995, pp. 1009-1013.

Worm, Alexander. "Turbo-Decoding Without SNR Estimation." IEEE Communications Letter, vol. 4, No. 6, Jun. 2000, pp. 193-195.

* cited by examiner

FIG. 8

| Cycle | First Generated Address Mux Port B | Second Generated Address | Stored First Address Mux Port A | Stored Second Address Mux Port C | Enable Gen. 1 | Enable Gen. 2 | Mux 70 Selected Port | Interleaved Address |
|---|---|---|---|---|---|---|---|---|
| 0 | A0 | A1 | — | — | ON | ON | B | A0 |
| 1 | A2 | — | A0 | A1 | ON | OFF | C | A1 |
| 2 | A3 | — | A2 | A1 | ON | OFF | A | A2 |
| 3 | A4 | — | A3 | A1 | ON | OFF | A | A3 |
| ... | | | | | | | | |
| 7 | A7-invalid | — | A6 | A1 | ON | OFF | A | A6 |
| 8 | A8 | A9 | A7-invalid | A1 | ON | ON | B | A8 |
| 9 | A10 | — | A8 | A9 | ON | OFF | C | A9 |
| 10 | A11 | — | A10 | A9 | ON | OFF | A | A10 |

# LOW POWER OPERATION OF AN ADDRESS INTERLEAVER

BACKGROUND OF THE INVENTION

1. Field of the Invention

The present invention relates to the field of turbo coding, and more particularly, a low power operation of address interleaving in the turbo coding process.

2. Description of Related Art

Turbo coding is one of the most important components for data transmission in the third generation (3G) wireless standards such as the Universal mobile telephone standard (UMTS). Turbo coding provides forward error correction with exceptional coding gain, and provides for almost error-free data transmissions for all but the lowest signal-to-noise ratio (SNR) environments. The key component of the turbo coding structure is the interleaver which permutes the data sequence between the two constituent decoders. Research has shown that the overall performance of turbo codes are directly related to the "randomness" of the interleaver between the blocks.

The 3GPP standard defines the interleaver for turbo codes as a function based on the block sizes in the range of 40 to 5114 bits. The 3GPP interleaver uses a basic block interleaver structure with a complex inter-row and intra-row permutation to generate a pseudo-random interleaving pattern. While these permutations provide excellent algorithmic performance, they severely complicate the hardware implementation of the interleaver.

One possible architecture for a hardware address interleaver is to use a large memory which contains the entire address interleaving sequence. Thus the turbo components simply access the memory to retrieve the next interleaved address. This is the most straightforward implementation, but the entire table must be recalculated when the block size changes. While the overhead in loading the table may be acceptable for a mobile terminal, infrastructure turbo decoders may need to deal with multiple block sizes, one right after another.

An alternative to using a large memory based hardware address interleaver in a turbo decoder, is to generate an interleaved address on the fly. However, when an invalid address is generated, a discontinuous stream of interleaved addresses is created. Namely, there will be a cycle of operation in which no valid address is generated.

SUMMARY OF THE INVENTION

The present invention provides a method and apparatus for generating interleaved addresses on the fly in which a continuous stream of interleaved addresses is produced. Furthermore, the present invention provides a low power consumption method and apparatus for producing the continuous stream of interleaved address.

The low power interleaved address generation architecture of the present invention includes a first interleaved address generator and a second interleaved address generator operating concurrently. A controller controls a selector to selectively output the first and second interleaved addresses such that for each cycle of operation, a valid interleaved address is output. The controller also disables the second interleaved address generator when the second interleaved address is not needed to produce a continuous stream of interleaved addresses. In this manner, power consumption is reduced while still producing a continuous stream of interleaved addresses.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIG. 8 illustrates an exemplary operation of the architecture of FIG. 7.

DETAILED DESCRIPTION OF EMBODIMENTS

Figure 1:
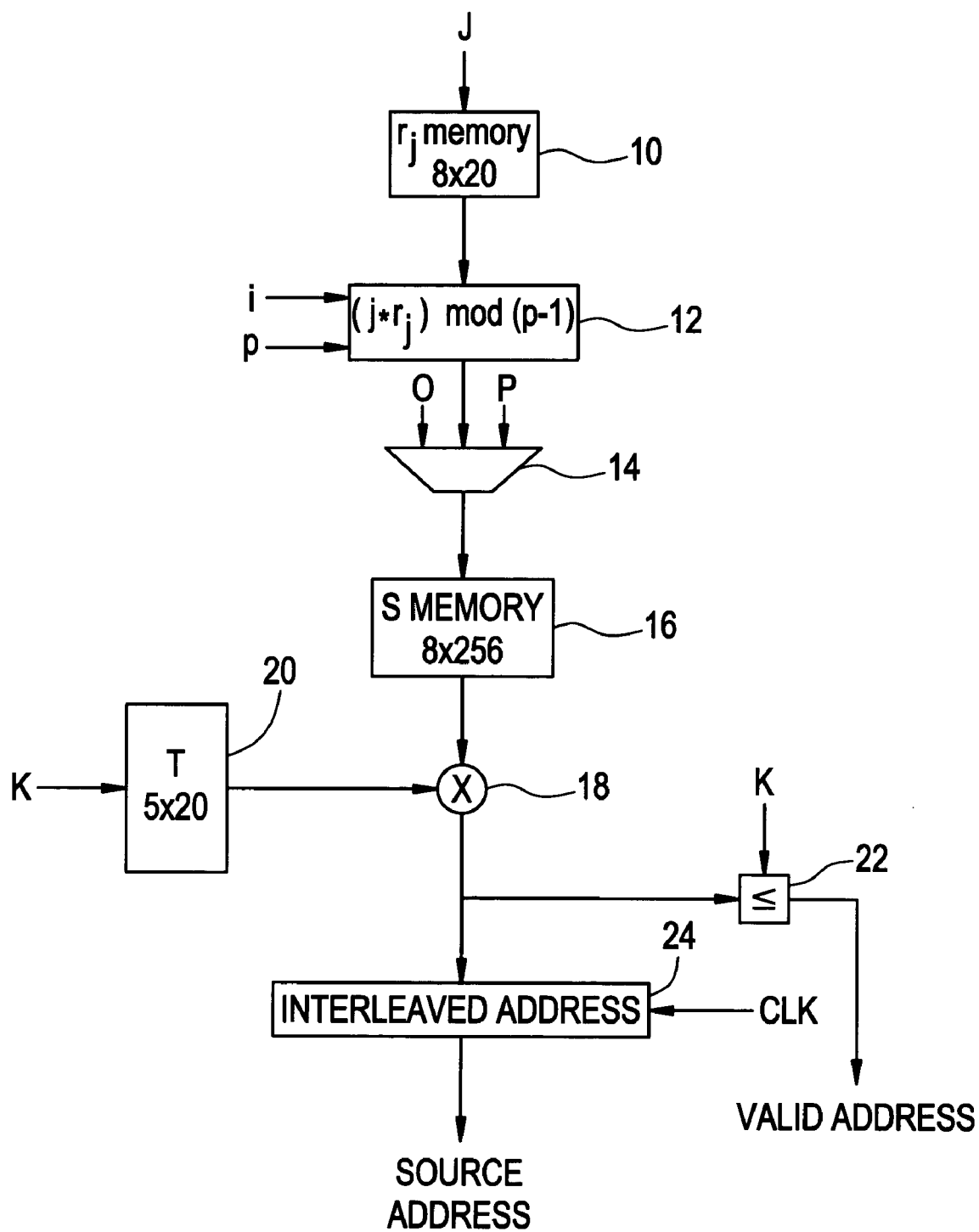
FIG. 1 shows an overall architecture for the address interleaver structure.

Initially, the general methodology of generating an interleaved address will be described followed by a description of the general architecture for generating the interleaved address. Next, a description of the methodology for generating an interleaved address will be described. Further, an embodiment for implementing the methodology will be described. Another architecture, one for generating both a current and a next interleaved address will then be described. Afterwards, a low power interleaver architecture for generating a continuous stream of valid interleaved addresses will be described, followed by a description of a general architecture for providing a continuous stream of valid addresses.

General Methodology for Generating an Interleaved Address

A method for producing an interleaved address may include several steps. An exemplary method includes the steps of formatting the input data bits into a rectangular matrix, performing intra-row and inter-row permutations on the rectangular matrix, and outputting the bits from the rectangular matrix with pruning.

The first step is to format the input bits into a rectangular matrix. If K is the number of inputs bits in the data block to encode (i.e., the block size), the first item that needs to be found is the number of rows, R, in the basic block interleaver structure. Equation (1) demonstrates the selection process for R, wherein one of three values, 5, 10 or 20 is selected.

$$R = \begin{cases} 5, & K \in [40, 159] \\ 10, & K \in [160, 200] \cup [481, 530] \\ 20, & K \in [201, 480] \cup [531, 5114] \end{cases} \quad (1)$$

The number of columns in the block interleaver is determined by calculating the minimum prime number that can solve equation (2).

$$p = \begin{cases} 53, & K \in [481, 530] \\ \min p \therefore (p+1) - \dfrac{K}{R} \geq 0, & \text{others} \end{cases} \quad (2)$$

Then, the number of columns in the table can be computed based on the prime number as seen in equation (3).

$$C = \begin{cases} p-1, & \left(p - \dfrac{K}{R} \geq 0\right) \text{ and } \left(p - 1 - \dfrac{K}{R} \geq 0\right) \\ p, & \left(p - \dfrac{K}{R} \geq 0\right) \text{ and } \left(p - 1 - \dfrac{K}{R} < 0\right) \\ p+1, & \text{others} \end{cases} \quad (3)$$

Once these three variables are known, R, p and C, the data can be written into a block interleaver table in sequential order, row by row. Note that the last row written may only be partially filled, so the rest of the row is loaded with zeroes.

The next step is to compute the intra-row sequence. To do this, the primitive root associated with the precalculated value of p is selected from Table 1 below based on the value of p.

TABLE 1

Prime numbers p and the associated primitive root v

| p | v | p | v | p | v | p | v | p | v |
|---|---|---|---|---|---|---|---|---|---|
| 7 | 3 | 4 | 5 | 10 | 2 | 15 | 5 | 22 | 3 |
| 11 | 2 | 5 | 2 | 10 | 5 | 16 | 2 | 22 | 2 |
| 13 | 2 | 5 | 2 | 10 | 2 | 16 | 5 | 22 | 6 |
| 17 | 3 | 6 | 2 | 10 | 6 | 17 | 2 | 23 | 3 |
| 19 | 2 | 6 | 2 | 11 | 3 | 17 | 3 | 23 | 7 |
| 23 | 5 | 7 | 7 | 12 | 3 | 18 | 2 | 24 | 7 |
| 29 | 2 | 7 | 5 | 13 | 2 | 19 | 19 | 25 | 6 |
| 31 | 3 | 7 | 3 | 13 | 3 | 19 | 5 | 25 | 3 |
| 37 | 2 | 8 | 2 | 13 | 2 | 19 | 2 | | |
| 41 | 6 | 8 | 3 | 14 | 2 | 19 | 3 | | |
| 43 | 3 | 9 | 5 | 15 | 6 | 21 | 2 | | |

The values of p and v serve to generate the intra-row permutation sequence s(i).

$$s(i) = [v \times s(i-1)] \bmod p, i=1,2,\ldots,(p-2), s(0)=1 \quad (4)$$

Let $q_0$ be the $1^{st}$ prime integer in the sequence $\{q_j\}$. $\{q_j\}$ is generated as follows:

$$g.c.d.\{q_j, p-1\} = 1, q_j > 6, q_j > q_{(j-1)}, \quad (5)$$

where g.c.d. is the greatest common denominator $\{q_j\}$ is permuted to the inter-row sequence $\{r_j\}$ such that $$r_{T(j)} = q_j, j=0,1,\ldots,R-1, \quad (6)$$

where T(j) (j=0,1,2,...,R-1) is the inter-row permutation pattern defined by one of the four sequences Pat$_1$ 19, 9, 14, 4, 0, 2, 5, 7, 12 18, 10, 8, 13, 17, 3, 1, 16, 6, 15,
Pat$_2$ 19, 9, 14, 4, 0, 2, 5, 7, 12, 18, 16, 13, 17, 15, 3, 1, 6, 11,
Pat$_3$ 9, 8, 7, 6, 5, 4, 3, 2, 1, 0
Pat$_4$ 4, 3, 2, 1, 0 where these patterns are selected as follows based upon the current block size $$\{T(0), T(1), T(2), \ldots, T(R-1)\} = $$

$$\begin{cases} Pat_4 & \text{if } (40 \leq K \leq 159) \\ Pat_3 & \text{if } (160 \leq K \leq 200) \\ Pat_1 & \text{if } (201 \leq K \leq 480) \\ Pat_3 & \text{if } (281 \leq K \leq 530) \\ Pat_1 & \text{if } (531 \leq K \leq 2280) \\ Pat_2 & \text{if } (2281 \leq K \leq 2480) \\ Pat_1 & \text{if } (2481 \leq K \leq 3160) \\ Pat_2 & \text{if } (3161 \leq K \leq 3210) \\ Pat_1 & \text{if } (3211 \leq K \leq 5114) \end{cases}$$

Intra-row permutations are performed as follows:
if (C=p) then $$U_j(i) = s([i \times r_j] \bmod (p-1)), i=0,1,2,\ldots,(p-2)., U_j(p-1) = 0,$$

where $U_j(i)$ is the input bit position of the i-th output after the permutation of the j-th row.
end if
if (C=p+1) then $$U_j(i) = s([i \times r_j] \bmod (p-1)), i=0,1,2,\ldots,(p-2)., U_j(p-1) = 0$$
$$\text{and } U_j(p) = p,$$

where $U_j(i)$ is the input bit position of the i-th output after the permutation of the j-th row.
end if
if (C=p−1) then $$U_j(i) = s([i \times r_j] \bmod (p-1)), i=0,1,2,\ldots,(p-2).$$

where $U_j(i)$ is the input bit position of the i-th output after the permutation of the j-th row.
end if The inter-row permutation based upon the pattern T(j) (j=0,1,2,..., R−1) is performed, where T(1) is the original row position of the j-th permuted row.

The final step concerns the pruning of addresses that resulted from the partially filled row mentioned previously. If the generated address is larger than the current block length then the generated address is discarded.

General Architecture for Generating an Interleaved Address

FIG. 1 shows an overall architecture for the address interleaver structure. The other components forming the turbo decoder have not been show for the sake of clarity, and are well-known in the art. Accordingly, it will be appreciated, particularly from the description of the general methodology above and the following description, that the generation of the various inputs to this overall architecture are well-known. The architecture is partitioned into several sections, and follows closely from the 3GPP algorithm.

As shown, a first look-up table 10 stores the inter-row sequence numbers, and outputs one of the inter-row sequence numbers using a received row index j as an address. A mod computation device 12 generates an intra-row permutation address by computing (i*$r_j$) mod (p−1). The intra-row permutation address, zero and p are supplied to a selector 14. The selector 14 normally outputs the intra-row permutation address, but when the number of rows and columns equals the block size, the first and last column are swapped by the selector 14 when the last row is being processed to maintain relative ordering of the number patterns from block size to block size.

A second look-up table 16 stores the intra-row permutation sequences S (see equation 4), and outputs one of the intra-row permutation sequences using the output from the selector 14 as an address. A multiplier 18 receives the intra-row permutation sequence from the second look-up table 16 and an inter-row permutation pattern from a third look-up table 20. The third look-up table 20 stores the inter-row permutation patterns discussed above, and outputs one of the inter-row permutation patterns based on the block size K.

The product generated by the multiplier 18 is a generated interleaved address. A comparator 22 makes sure the resulting address is within the range of K, the block size, and outputs a valid address signal if the interleaved address is in the range of K. If the address is outside the range, the interleaver architecture must wait another cycle to provide the next valid address. During the comparison operation, the generated interleaved address is stored in a register 24 that is clocked by a clock of the turbo decoder.

Performing the MOD Operation with Decomposition

As will be appreciated, the components forming the architecture of FIG. 1 are straightforward, consisting of either memories, registers, or simple arithmetic units. Of these components, the mod computation device 12 tends to have the greatest complexity and non-deterministic computation time. A methodology of performing the mod operation that reduces complexity and computation time will now be described.

For a given block size K, the mod divisor p−1 is fixed. Given this pseudo-static value for p−1, the properties of mod can be taken advantage of to provide a much simpler solution. Consider equation (7) below which shows that the mod of a number can be broken down into a summation of mod operations onto the individual components that make up the number. In this case, equation (7), breaks up the dividend into its binary components and computes the mod of each power of two number. Each of the individual results are summed together, and then a final mod operation is performed.

$$\left[\sum_{i=0}^{x-1} y_i 2^i\right] \mod(p-1) = \left[\sum_{i=0}^{x-1} y_i [2^i \mod(p-1)]\right] \mod(p-1) \quad (7)$$

$$y_i \in \{0, 1\}$$

Figure 2:
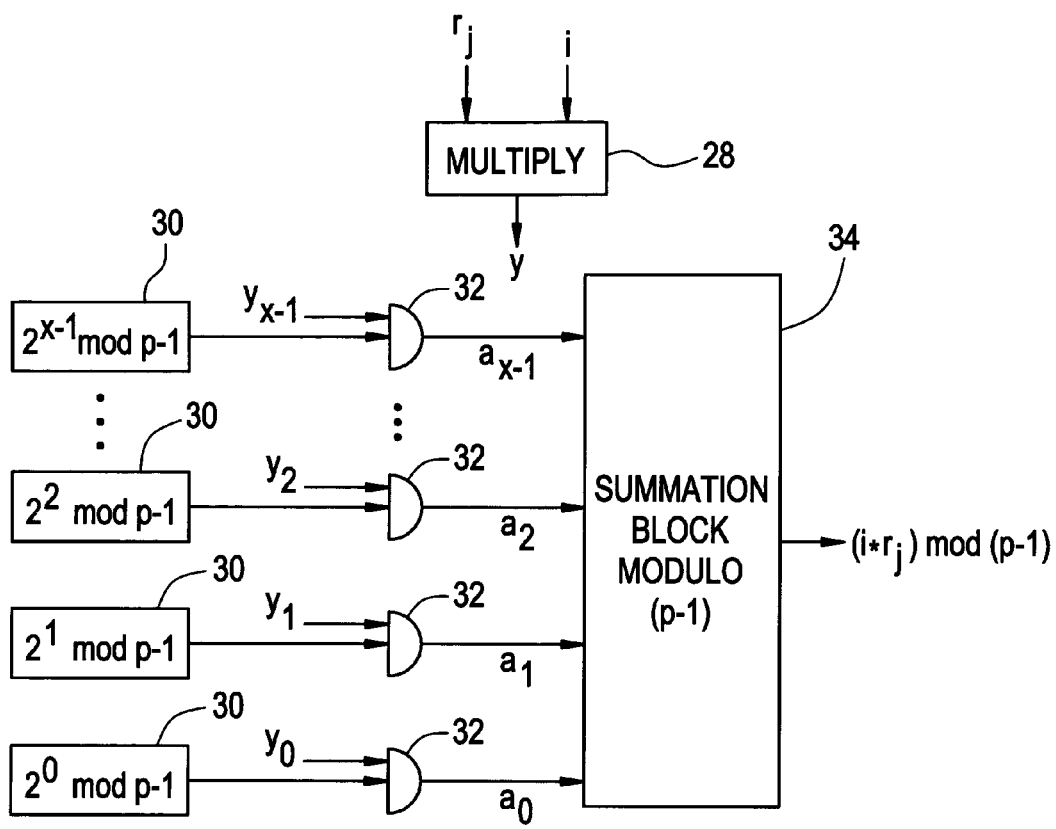
FIG. 2 shows an architecture for implementing the mod decomposition according to the present invention.

FIG. 2 shows an architecture for implementing the mod decomposition of equation (7). As shown, a multiplier 28 multiplies the column index and the inter-row sequence number to produce a binary product y. As further shown, the power of two mod calculations are pre-computed and stored into registers 30. These values are only changed when the block size changes, and only have to be downloaded at the beginning of the block. The binary product y represents the dividend of the mod operation. Each binary component (i.e., bit) is input along with a corresponding power of two mod value by an AND gate 32. For example, the least significant binary component y0 and the zeroth order power of two mod value are input by one of the AND gates 32, the next significant binary component y1 and the first order power of two mod value are input by the next AND gate 32, etc. The AND gates 32 logically AND the inputs to generate intermediate mod values $a_0, a_1, \ldots a_{x-1}$, which are passed to a modulo summation block 34.

Figure 3:
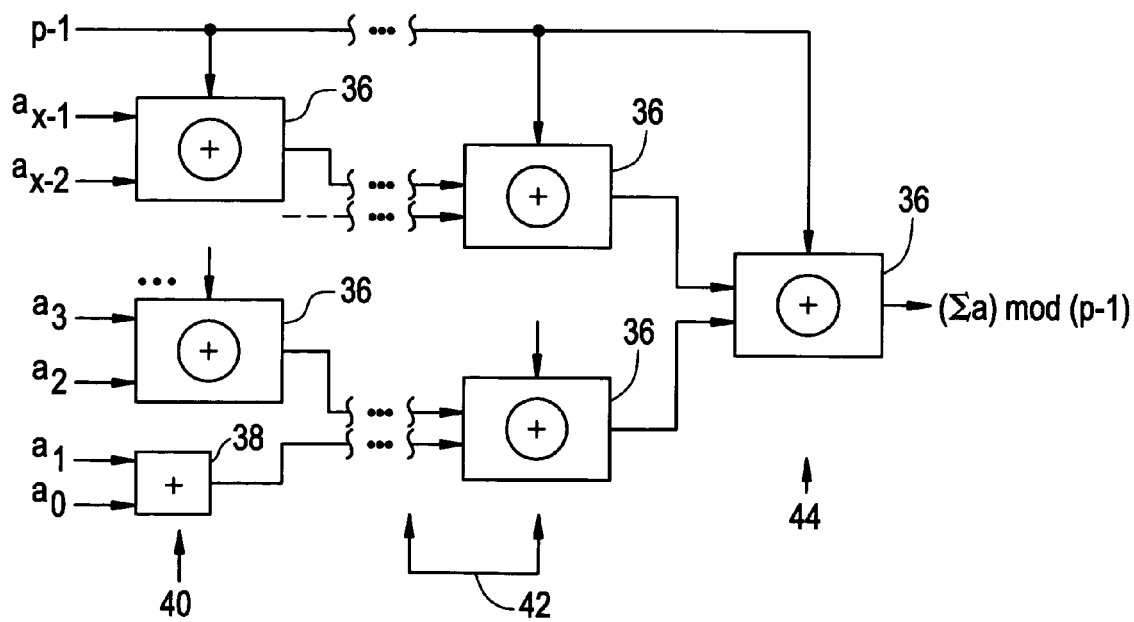
FIG. 3 illustrates the modulo summation block of FIG. 2 in greater detail.

FIG. 3 illustrates the modulo summation block 34 in greater detail. As shown, the modulo summation block 34 has a tree structure to minimize the propagation delay. Namely, the modulo summation block 34 has a base level 34, a number of intermediate levels 42 and a final level 44. Each level includes one or more modulo adders 36. Each modulo adder adds two input numbers together and generates the mod p−1 result of the sum. Accordingly, the base level 40 includes a modulo adder 36 for every two intermediate mod values a, the intermediate levels 42 include a modulo adder 36 for every two modulo adders 36 in the previous level, and the final level 44 includes a single modulo adder 36. As will be appreciated, the number of intermediate levels 42 is a number necessary to generate two outputs to the final level 44. When the modulo summation block 34 is used specifically with the 3GPP standard, the smallest possible value of p−1 is 6. Therefore, the first two intermediate mod values from FIG. 2 are at most 1 and 2 regardless of p−1 (i.e., 1 MOD 6=1, 2 MOD 6=2) so a simple adder 38 can be used in place of a modulo adder 36 because the value is guaranteed to be in modulo p−1 arithmetic. For the purposes of example only, this has been illustrated in FIG. 3.

Figure 4:
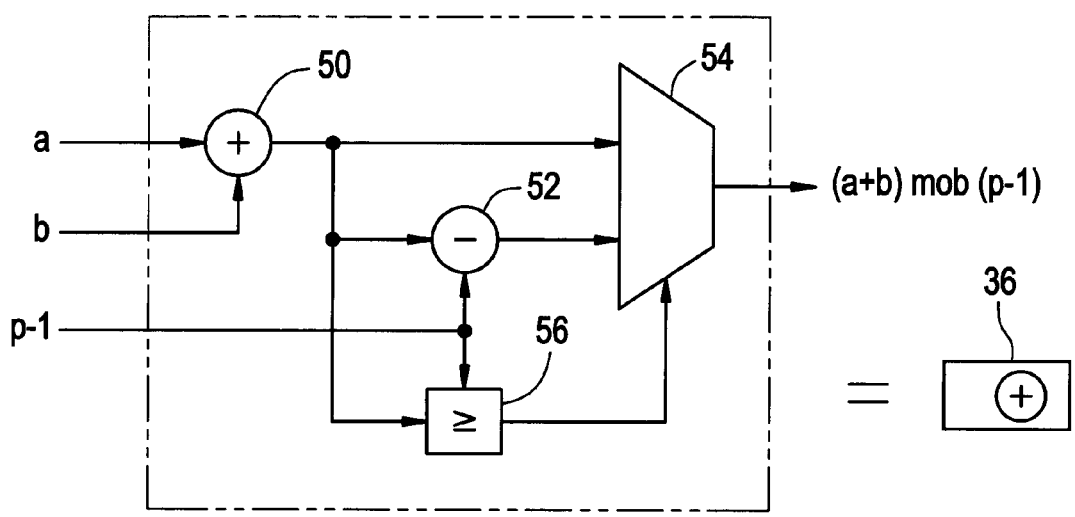
FIG. 4 illustrates an embodiment of a modulo adder in FIG. 2.

As discussed above, the modulo adders 36 perform two functions. First, they add the two input numbers together. Second, they check the sum and determines if the sum lies outside of the mod field. If so, the output value is wrapped around relative to the mod field. FIG. 4 illustrates an embodiment of a modulo adder 36. As shown, the modulo adder 36 includes an adder 50 adding inputs a and b, and a subtractor 52 subtracting the mod operand (e.g., p−1) from the sum of a+b. A selector 54 selectively outputs one of a+b and (a+b)−(p−1). A comparator 56 compares the value (p−1) to the sum a+b, and controls the selector 54 to output the sum a+b if the sum a+b is less than or equal to the value (p−1). Otherwise, the comparator 56 instructs the selector 54 to select the output of the subtractor 52.

Continuous Address Generation

Figure 5:
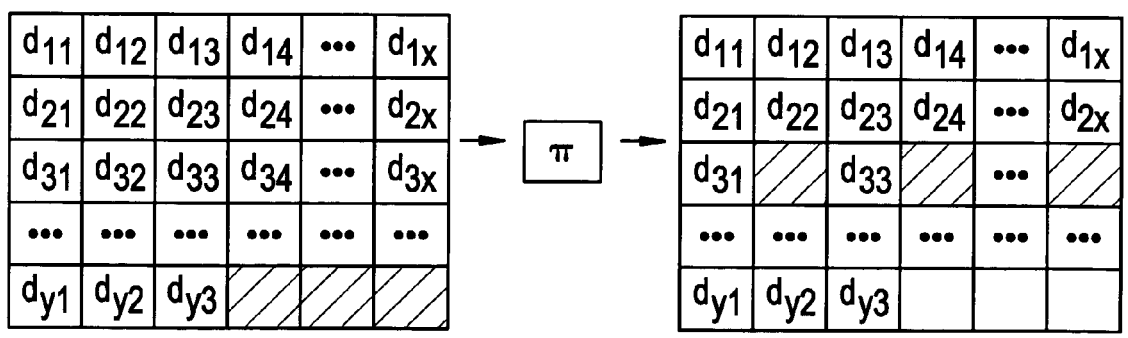
FIG. 5 shows a simple example of the interleaving process and how invalid addresses are generated.

A problem with interleaved address generators is that occasionally they generate addresses that are outside the valid range of the block size. When an address is generated outside of the range, the architecture produces a flag which identifies if the output is invalid, and then the architecture must wait another clock cycle before the next sequential interleaved address is valid. Over a large block size, this can create a large overhead in the turbo decoding process. FIG. 5 shows a simple example of the interleaving process and how invalid addresses are generated. Since the ranges of block sizes are continuous between 40 and 5114, the exact number of elements do not always fit exactly into the rectangular array defined by R and C. The values fill the array row by row, but the last row has some elements that are empty. In the process of interleaving, both the rows and columns are permutated based on the interleaving equations, and the empty cells are spread across a row. Thus when the interleaver starts to retrieve source addresses, occasionally it will generate an access to an empty cell.

With puncturing, the interleaver does not know that it has an invalid address until it has actually calculated the final address and compared the final address with the valid range of values. One solution is to make sure that the address generator is actually calculating both the current address and the next address at the same time. With both addresses available, the address interleaver first checks if the current generated address is valid. If the address is valid, the current address is used, but if the current address is not valid, the architecture can immediately substitute the next address. Because the interleaver proceeds in row-by-row basis, if the current address is invalid, the next address is guaranteed to be a valid address because all of the empty spaces come from the same row.

Figure 6:
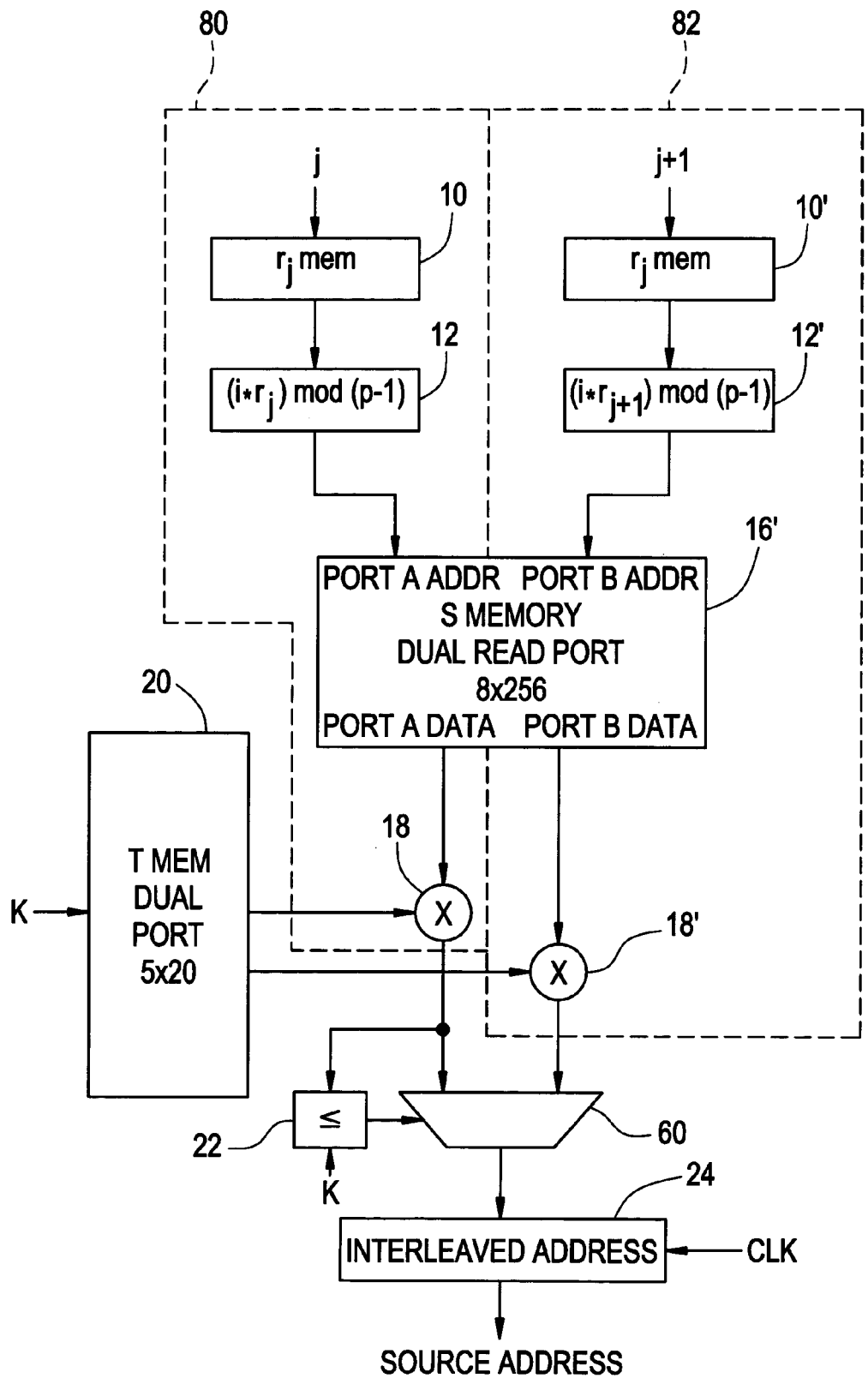
FIG. 6 shows the address interleaver architecture that generates both the current and next address at the same time.

FIG. 6 shows the address interleaver architecture that generates both the current and next address at the same time. In FIG. 6, selector 14 has been deleted for the sake of clarity. As shown, the first look-up table 10 generates the current inter-row sequence number using the current row index j as an address and a duplicate first look-up table 10' generates the next inter-row sequence number using the next row index j+1. The mod computation device 12 generates the current intra-row permutation address by computing $(i*r_j) \mod (p-1)$. And, another mod computation device 12' generates the next intra-row permutation address by computing $(i*r_{j+1}) \mod (p-1)$. The mod computation devices 12 and 12' employ the methodology and architecture discussed above with respect to FIGS. 2 and 3.

A second look-up table 16' stores the intra-row permutation sequences S (see equation 4). The second look-up table 16' is a two input port (A and B), two output port (A and B) memory, and outputs the current and next intra-row permutation sequences using the current and next intra-row permutation addresses, respectively. If a dual-port memory is not available a single memory can be used provided a double-rate clock is used to access the memory twice for every symbol required on the output, or two separate single port memories can be used. Multipliers 18 and 18' respectively receive the current and next intra-row permutation sequences from the second look-up table 16' and also receive an inter-row permutation pattern from the third look-up table 20. The products generated by the multipliers 18 and 18' are current and next interleaved addresses, respectively. Accordingly, the architecture of FIG. 6 represents first and second interleaved address generators 80 and 82 that, in the embodiment of FIG. 6, share a dual port memory; but as described above, the first and second interleaved address generators can be structurally independent.

A multiplexer or selector 60 receives the current and next interleaved addresses, and selectively outputs one of the current and next interleaved addresses based on output from the comparator 22. The comparator 22 makes sure the current interleaved address is within the range of K, the block size, and outputs a valid address signal if the interleaved address is in the range of K. If valid, the output from the comparator 22 causes the multiplexer 60 to output the current interleaved address. If invalid, the output from the comparator 60 causes the multiplexer 60 to select the next interleaved address. Accordingly, processing time is reduced by not having to wait for the next valid interleaved address to be generated.

Low Power Continuous Address Generation

Figure 7:
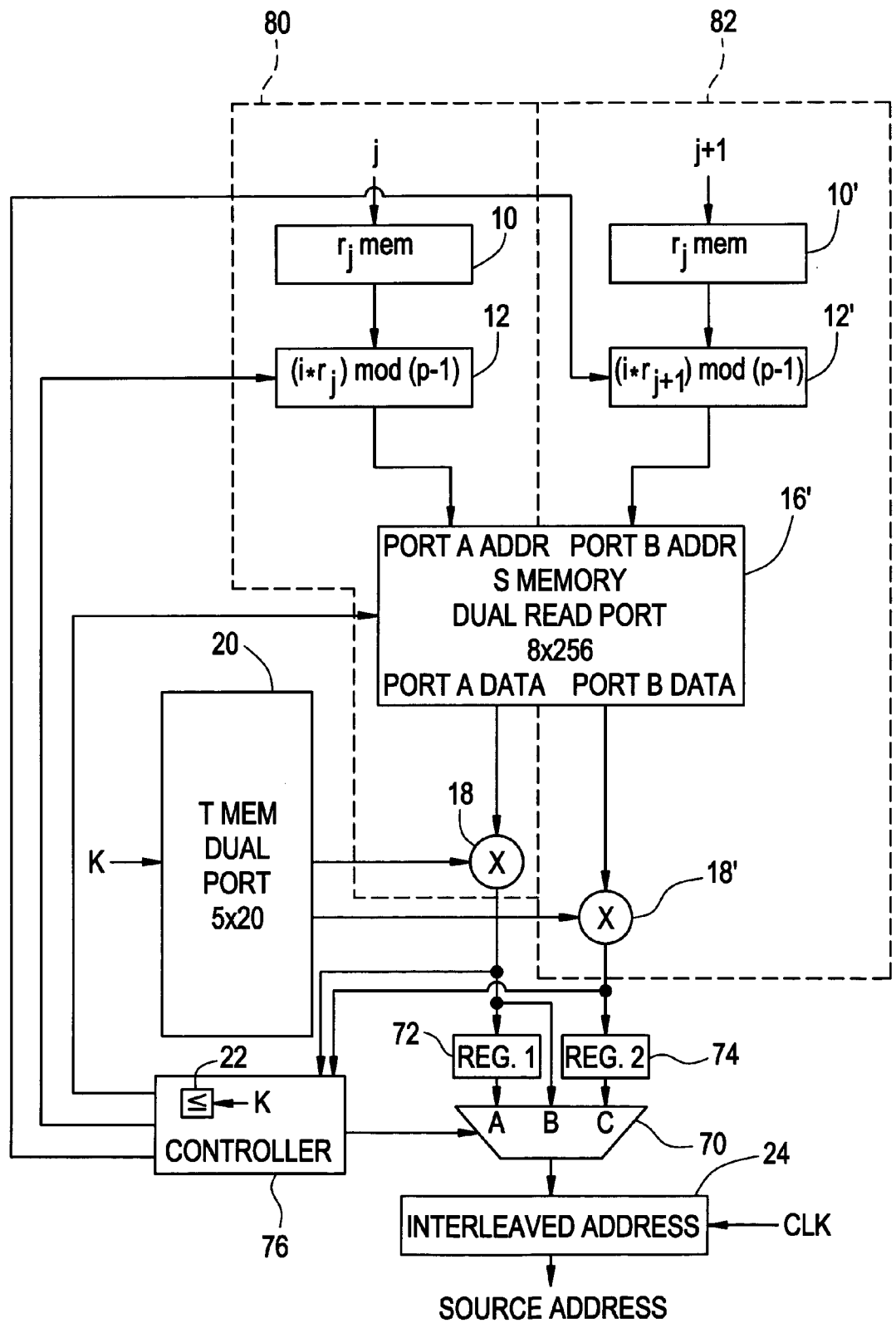
FIG. 7 illustrates a low power address interleaver architecture according to an embodiment of the present invention that provides a continuous stream of valid interleaved addresses.

FIG. 7 illustrates a low power address interleaver architecture according to an embodiment of the present invention that provides a continuous stream of valid interleaved addresses. As shown, the embodiment of FIG. 7 is the same as the embodiment of FIG. 6 except that the mod computation devices 12 and 12' and the second look-up table 16' have enable ports; a first register 72 and a second register 74 store outputs from the multipliers 18 and 18', respectively; the multiplexer 60 has been replaced with a multiplexer 70; and a controller 76 receives the output from the multipliers 18 and 18' and controls operation of the multiplexer 70, enablement of the first and second mod computation devices 12 and 12' and enablement of the second look-up table 16'. Accordingly, for the sake of brevity, only these differences will be described in detail.

The controller 76 may enable and disable operation of the either or both of the mod computation devices 12 and 12' by sending control signals to the enable ports of the mod computation devices 12 and 12'. The controller 76 may also enable and disable generation of the intra-row permutation sequences for output at either or both of the output ports of the second look-up table 16'. By disabling, for example, the second mod computation device 12' and generation of the intra-row permutation sequence at port B of the second look-up table 16', the controller 76 disables generation of the second or next interleaved address output from the second multiplier 18'. Accordingly, the controller 76 may selectively enable and disable generation of the first and second interleaved addresses. Stated another way, the controller 76 may selectively enable and disable the first and second interleaved address generators 80 and 82 generating the first and second interleaved addresses, respectively.

When the first and/or second interleaved address generators 80 and 82 are disabled, the components forming the disabled interleaved address generator do not operate and consume power. Accordingly, power consumption may be reduced by disabling the first and/or second interleaved address generators 80 and 82 when their operations is not required.

The multiplexer 70 receives the generated first interleaved address at its port B, the stored first interleaved address (which is a previous interleaved address with respect to the generated first interleaved address) at its port A, and the stored second interleaved address at its port C. The controller 76 controls whether the multiplexer 70 outputs the interleaved address at port A, port B or port C.

Next, an exemplary operation of the architecture of FIG. 7 for producing a continuous stream of interleaved address while reducing power consumption will be described with respect to table 1 illustrated in FIG. 8. During a first cycle of operation, the controller 76 enables operation of both the first and second interleaved address generators 80 and 82. As shown in FIG. 8, the first and second interleaved addresses A0 and A1 are generated, where the second interleaved address A1 is a next or subsequent interleaved address with respect to the first interleaved address A0. The order of the interleaved addresses is denoted by the numeral following the letter 'A' (for address). The controller 76 controls the multiplexer 70 to output the generated first interleaved address A0 if the address is valid. As will be appreciated by those skilled in the art, because of the method of interleaved address generation described in detail above, at least the first two interleaved addresses A0 and A1 will be valid. The interleaved addresses A0 and A1 are also stored by the first and second registers 72 and 74, respectively.

As a general rule, after the second interleaved address generator 82 generates one interleaved address, the controller 76 disables the second interleaved address generator 82. Accordingly, in the second cycle (cycle 1), the second interleaved address generator 82 is disabled and does not generate an interleaved address or consume power. The first interleaved address generator 80, however, is enabled and generates interleaved address A2. The controller 76 controls the multiplexer 70 to output the interleaved address A1 at its port C, which is the stored second interleaved address A1. Also in cycle 1, the controller 76, which incorporates the comparator 22, determines if the interleaved address A2 is valid.

In this exemplary embodiment, interleaved address A0-A6 are assumed valid, and the first invalid interleaved address is interleaved address A7. Because the interleaved address generated in cycle 2 by the first interleaved address is valid, in the next cycle (cycle 3), the second interleaved address generator 82 remains disabled and the first interleaved address generator 80 remains enabled. As a result, the first interleaved address generator 80 generates the interleaved address A3. Also, the controller 76 controls the multiplexer 70 to output the interleaved address at its port A, which is the stored first interleaved address A2. The operation of cycle 3 then repeats for cycles 4-7.

However, in cycle 7, the generated first interleaved address A7 is invalid (the address A7 is greater than the block size K). As a result, in cycle 8 the controller 76 enables the second interleaved address generator 82. Namely, in the cycle subsequent to a cycle in which an invalid address was generated, the controller 76 enables the second interleaved address generator 82. In cycle 8, the first and second interleaved addresses are A8 and A9, respectively, are generated. The controller 76 controls the multiplexer 70 to output the generated first interleaved address A8 at its port B.

In the next cycle, cycle 9, the operation of cycle 1 repeats. Namely, the controller 76 disables the second interleaved address generator 82 and controls the multiplexer 70 to output the stored second interleaved address A9 at its port C. As will be appreciated, when an invalid address is determined, the controller 76 enables the second interleaved address generator 82 for one cycle. Because of the limited number of invalid addresses, the second interleaved address generator 82 remains idle and does not consume power for a large portion of the continuous on-the-fly interleaved address generation process. For the whole range of 3GPP block sizes of 40 to 5114, only 1.4% of the generated interleaved addresses are invalid. Consequently, the present invention achieves a great savings in power consumption by disabling the operation of the second interleaved address generator 82 when its operation is not needed to maintain a continuous stream of interleaved addresses.

The operation during cycle 10 is the same as described above with respect to cycle 3. As will be appreciated, when an invalid address is generated by the first address generated in a given cycle, the operation will proceed as described above with respect to cycles 8-10.

While the exemplary operation was described as selectively enabling and disabling the operation of the second interleaved address generator 82, it will be appreciated that a similar operation may be conducted by enabling and disabling the first interleaved address generator 80 instead, or flipping between selectively enabling and disabling the first and second interleaved address generators 80 and 82.

The invention being thus described, it will be obvious that the same may be varied in many ways. For example, by inserting additional registers into the embodiment of FIG. 7 (e.g., between the mod computation devices 12 and 12' and the second look-up table 16'), pipelined generation of addresses can be achieved. It will be appreciated that the second address generator 82 will then remain enabled for additional cycles depending on the length of the pipeline. Such variations are not to be regarded as a departure from the spirit and scope of the invention, and all such modifications as would be obvious to one skilled in the art are intended to be included within the scope of the following claims.

We claim:

1. A method of generating interleaved addresses, comprising:
concurrently generating first and second interleaved addresses by a first interleaved address generator and a second interleaved address generator, respectively, wherein the generated second interleaved address is a next interleaved address with respect to the generated first interleaved address;
disabling the second interleaved address generator after the concurrently generating step;
enabling the second interleaved address generator to concurrently generate the second interleaved address with the first interleaved address generator generating the first interleaved address if the generated first interleaved address is an invalid interleaved address;
storing the generated first and second interleaved addresses;
first outputting the stored first interleaved address if the generated first interleaved address is invalid;
second outputting a next generated first interleaved address in a cycle subsequent to a cycle of the first outputting.

2. The method of claim 1, further comprising:
third outputting the stored second interleaved address in a cycle subsequent to a cycle of the second outputting.

3. The method of claim 2, further comprising:
fourth outputting the stored first interleaved address in cycles subsequent to a cycle of the third outputting if the stored first interleaved address is valid.

4. An apparatus for generating interleaved addresses, comprising:
a first interleaved address generator configured to generate a first interleaved address;
a second interleaved address generator configured to generate a second interleaved address substantially concurrently with the first interleaved address generator generating the first interleaved address; and
a controller configured to disable the second interleaved address generator from generating the second interleaved address after the first and second interleaved addresses have been generated.

5. The apparatus of claim 4, wherein the first and second interleaved address generators are embodied as an interleaved address generator configured to selectively generate one or two interleaved address during a cycle of operation.

6. The apparatus of claim 4, wherein the generated second interleaved address is a next interleaved address with respect to the generated first interleaved address.

7. The apparatus of claim 6, wherein the controller enables the second interleaved address generator if the generated first interleaved address is an invalid interleaved address.

8. The apparatus of claim 7, further comprising:
a first memory device storing the generated first interleaved address;
a second memory device storing the generated second interleaved address; and
a selector selectively outputting one of the generated first interleaved address, the stored first interleaved address and the stored second interleaved address.

9. The apparatus of claim 8, wherein the controller controls the selector to first output the stored first interleaved address if the generated first interleaved address is invalid, and second output a next generated first interleaved address in a cycle subsequent to a cycle of the first outputting.

10. The apparatus of claim 9, wherein the controller controls the selector to third output the stored second interleaved address in a cycle subsequent to a cycle of the second outputting.

11. The apparatus of claim 10, wherein the controller controls the selector to fourth output the stored first interleaved address in cycles subsequent to a cycle of the third outputting if the stored first interleaved address is valid.

12. An apparatus for generating interleaved addresses, comprising:
a first interleaved address generator configured to generate a first interleaved address;
a second interleaved address generator configured to generate a second interleaved address substantially concurrently with the first interleaved address generator generating the first interleaved address; and
a controller configured to enable the second interleaved address generator for a single cycle if the first interleaved address is invalid.

* * * * *